(12) United States Patent
Lee et al.

(10) Patent No.: US 7,485,482 B2
(45) Date of Patent: Feb. 3, 2009

(54) METHOD FOR MANUFACTURING VERTICAL GROUP III-NITRIDE LIGHT EMITTING DEVICE

(75) Inventors: Jae Hoon Lee, Kyungki-do (KR); Yong Chun Kim, Kyungki-do (KR); Hyung Ky Back, Kyungki-do (KR); Moon Heon Kong, Kyungki-do (KR); Dong Woo Kim, Choongcheongbook-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 484 days.

(21) Appl. No.: 11/401,329

(22) Filed: Apr. 11, 2006

(65) Prior Publication Data

US 2006/0234408 A1    Oct. 19, 2006

(30) Foreign Application Priority Data

Apr. 14, 2005    (KR) .................... 10-2005-0031107

(51) Int. Cl.
*H01L 21/00* (2006.01)
(52) U.S. Cl. .......................... 438/29; 438/46
(58) Field of Classification Search .................. 438/29, 438/46
See application file for complete search history.

(56) References Cited

U.S. PATENT DOCUMENTS

2006/0225644 A1* 10/2006 Lee et al. ..................... 117/89

2007/0121690 A1* 5/2007 Fujii et al. ................ 372/43.01

OTHER PUBLICATIONS

Daisuke Morita, et al., "Watt-Class High-Power 365 nm Ultraviolet Light-Emitting Diodes," Japanese Journal of Applied Physics, 2004, pp. 5945-5950, vol. 43, No. 9A, The Japan Society of Applied Physics.

Kenji Orita, et al., "High-Extraction-Efficiency Blue Light-Emitting Diode Using Extended-Pitch Photonic Crystal," Japanese Journal of Applied Physics, 2004, pp. 5809-5813, vol. 43, No. 8B, The Japan Society of Applied Physics.

* cited by examiner

*Primary Examiner*—Jack Chen
(74) *Attorney, Agent, or Firm*—McDermott Will & Emery LLP

(57) ABSTRACT

The invention provides a vertical group III-nitride light emitting device improved in external extraction efficiency and a method for manufacturing the same. The method includes forming an undoped GaN layer and an insulating layer on a basic substrate. Then, the insulating layer is selectively etched to form an insulating pattern, and an n-doped $Al_xGa_yIn_{(1-x-y)}N$ layer, an active layer and a p-doped $Al_mGa_nIn_{(1-m-n)}N$ layer are sequentially formed on the insulating pattern. A conductive substrate is formed on the p-doped $Al_mGa_nIn_{(1-m-n)}N$ layer. The basic substrate, the undoped gaN layer and the insulating pattern are removed, and an n-electrode is formed on a part of the exposed surface of the n-doped $Al_xGa_yIn_{(1-x-y)}N$ layer.

18 Claims, 6 Drawing Sheets

7,485,482 B2

METHOD FOR MANUFACTURING VERTICAL GROUP III-NITRIDE LIGHT EMITTING DEVICE

CLAIM OF PRIORITY

This application claims the benefit of Korean Patent Application No. 2004-31107 filed on Apr. 14, 2005, in the Korean Intellectual Property Office, the disclosure of which is incorporated herein by reference.

BACKGROUND OF THE INVENTION

1. Field of the Invention

The present invention relates to a method for manufacturing a group III-nitride light emitting device, and more particularly, a method for manufacturing a vertical group III-nitride light emitting device improved in external extraction efficiency.

2. Description of the Related Art

Since development of a light emitting diode (LED) including a group III-nitride semiconductor, it has been utilized as a light source in a variety of areas such as a liquid crystal display (LCD) backlight, a mobile phone keypad, a illumination lighting source and the like. Regarding development of the LED for wide-ranging purposes, light-emitting efficiency and heat releasing properties thereof have emerged as a significant factor. Light-emitting efficiency of the LED is determined by light generation efficiency, extraction efficiency and amplification efficiency by fluorescent material. Most of all, the biggest problem concerns low extraction efficiency, that is, light generated is externally extracted at a low efficiency. The greatest hurdle against light extraction out of the LED is extinction of light resulting from total internal reflection. That is, big refractivity differences at an interface of the LED allows only about 20% of light generated to exit outside the interface of the LED. The light totally reflected at the interface travels inside the LED and is reduced to heat. This increases a heat release rate of the LED, and decreases external extraction efficiency of the LED, thus shortening lifetime thereof.

To overcome this problem, suggestions have been made regarding methods for improving external extraction efficiency. For example, a surface pattern or a surface texture is formed on the LED to enable a photon arriving at its surface to scatter randomly. Alternatively, the light emitting device is shaped as a truncated inverted pyramid. Furthermore, in another recent method, to form a photonic crystal, the LED surface is patterned such that a photon of a specified wavelength is transmitted or reflected selectively. "High-Extraction-Efficiency Blue Light-Emitting Diode Using Extended-Pitch Photonic Crystal" by Kenji Orita et al., Japanese Journal of Applied Physics, Vol. 43, No. 8B, 2004, pp. 5809-5813 discloses such a method in which a p-doped cladding layer is selectively dry etched to form rough patterns of photonic crystal on the upper surface of the cladding layer.

FIG. 1 is a sectional view illustrating a conventional group III-nitride light emitting device having a photonic crystal on the upper surface thereof. With reference to FIG. 1, the conventional group III-nitride light emitting device 10 includes an n-doped GaN cladding layer 13, an active layer 15, a p-doped GaN cladding layer 17 sequentially formed on a sapphire substrate 11. On one side of the p-doped GaN cladding layer 17, a p-electrode 21 is formed, and on the upper surface of the n-doped GaN cladding layer 13 which is exposed via mesa etching, an n-electrode 23 is formed. In addition, a transparent electrode layer 19 is formed on the p-doped GaN cladding layer 17. As shown in FIG. 1, a rough pattern 25 of photonic crystal is formed on the upper surface of the p-doped GaN cladding layer 17. The rough pattern 25 functions to increase the extraction efficiency of the light emitting device. That is, the light incident on the rough pattern 25 is effectively extracted out of the light emitting device via scattering and diffraction.

In order to form such a rough pattern 25 of photonic crystal, a metal mask is formed via electron-beam lithography and the p-doped GaN cladding layer is selectively etched via Reactive Ion Etching (RIE). That is, after a nickel film (not shown) is deposited on the p-doped GaN cladding layer 17, the nickel film is patterned via electron-beam lithography to form a nickel pattern. This nickel pattern is used as an etching mask to dry-etch the p-doped GaN cladding layer 17 via RIE, thereby forming a rough pattern 25 of photonic crystal on the upper surface of the p-doped GaN cladding layer 17.

According to the above method of forming the rough pattern, however, there is a problem of increase in resistance of the p-doped GaN cladding layer 17. That is, due to the dry etching of the p-doped GaN cladding layer 17, p-type dopants such as Mg in the p-doped GaN cladding layer 17 become less active, which does not allow a sufficient amount of charge carrier. In addition, it is highly likely that the active layer 15 may be damaged by the reactive ion or plasma during the dry etching of the p-doped GaN cladding layer 17. Consequently, the product yield turns out low.

In an alternative way to manufacture a light emitting device having a photonic crystal, the sapphire substrate is separated and then a rough pattern is formed on the upper surface of the n-doped GaN cladding layer using electron-beam lithography and dry etching to manufacture an LED having a vertical structure ("Watt-Class High-Output-Power 365nm Ultraviolet Light Emitting Diodes" by Daisuke Morita et al., Japanese Journal of Applied Physics Vol. 43, No. 9A, 2004, pp. 5945-5950). However, with the sapphire substrate removed, it is very difficult to perform photo-etching on an upper surface of a thin-filmed GaN-based structure having a thickness of 10 μm or less, even with a conductive substrate used as a mount. Accordingly, this leads to significant decrease in yield.

SUMMARY OF THE INVENTION

The present invention has been made to solve the foregoing problems of the prior art and it is therefore an object of the present invention to provide a method for providing a vertical group III-nitride light emitting device having improved light extraction efficiency, which requires easier manufacturing process, allowing a greater yield.

According to an aspect of the invention for realizing the object, there is provided a method for manufacturing a vertical group III-nitride light emitting device comprising steps of:

(i) forming an undoped GaN layer and an insulating layer sequentially on a basic substrate;

(ii) selectively etching the insulating layer to form an insulating pattern on the undoped GaN layer;

(iii) sequentially forming an n-doped $Al_xGa_yIn_{(1-x-y)}N$ layer, where $0 \leq x \leq 1$, $0 \leq y \leq 1$, $0 \leq x+y \leq 1$, an active layer and a p-doped $Al_mGa_nIn_{(1-m-n)}N$ layer, where $0 \leq m \leq 1$, $0 \leq n \leq 1$, $0 \leq m+n \leq 1$, on the insulating pattern;

(iv) forming a conductive substrate on the p-doped $Al_mGa_nIn_{(1-m-n)}N$ layer;

(v) removing the basic substrate, the undoped GaN layer and the insulating pattern to expose a rough pattern on the n-doped $Al_xGa_yIn_{(1-x-y)}N$ layer; and (vi) forming an n-electrode on a part of the exposed surface of the n-doped $Al_xGa_yIn_{(1-x-y)}N$ layer.

Preferably, the basic substrate is a sapphire substrate according to an embodiment of the present invention. The conductive substrate may comprise a silicon substrate or a metal substrate.

According to a preferred embodiment of the present invention, the insulating layer comprises a silicon oxide film or silicon nitride film.

According to an embodiment of the present invention, the step (v) includes: separating or removing the basic substrate using a laser lift-off process; removing the undoped GaN layer using dry etching or chemical mechanical polishing (CMP); and removing the insulating pattern using wet etching.

According to an embodiment of the present invention, the n-doped $Al_xGa_yIn_{(1-x-y)}N$ layer is formed by growing n-doped $Al_xGa_yIn_{(1-x-y)}N$ via Epitaxial Lateral Overgrowth (ELOG). This ELOG allows lowering crystal defect density.

According to an embodiment of the present invention, the method further includes: forming a low-temperature GaN buffer layer on the basic substrate before the step (i).

According to an embodiment of the present invention, in the step (ii), the insulating pattern is not formed on a top surface area of the undoped GaN layer corresponding to the n-electrode. Thus, the rough pattern is not formed on the area corresponding to the n-electrode on the n-doped $Al_xGa_yIn_{(1-x-y)}N$ layer.

According to an embodiment of the present invention, the step (iv) comprises plating a metal layer on the p-doped $Al_mGa_nIn_{(1-m-n)}N$ layer. The metal layer formed by plating may comprise one selected from a group consisting of tungsten, copper, nickel, titan and alloys of at least two thereof. In this case, the metal layer plated on the p-doped $Al_mGa_nIn_{(1-m-n)}N$ layer becomes the conductive substrate.

According to another embodiment of the present invention, the step (iv) comprises preparing a preliminary conductive substrate beforehand and bonding the prepared preliminary conductive substrate on the p-doped $Al_mGa_nIn_{(1-m-n)}N$ layer using a conductive adhesive layer. The conductive adhesive layer may comprise material selected from a group consisting of Au, Au—Sn, Sn, In, Au—Ag and Pb—Sn.

According to an embodiment of the present invention, the method may further include forming a reflective layer on the p-doped $Al_mGa_nIn_{(1-m-n)}N$ layer between the step (iii) and the step (iv). Preferably, the reflective layer comprises one selected from a group consisting of a $CuInO_2$/Ag layer, a $CuInO_2$/Al layer and an Ni/Ag/Pt layer. In addition, a transparent electrode layer may be formed on the n-doped $Al_xGa_yIn_{(1-x-y)}N$ layer after the step (v).

According to an embodiment of the present invention, the rough pattern formed on the n-doped $Al_xGa_yIn_{(1-x-y)}N$ layer comprises convexes or concaves which are spaced from each other in the range of 20 nm to 100 μm and have a width and a height of 20 nm to 100 μm. More preferably, the rough pattern formed on the n-doped $Al_xGa_yIn_{(1-x-y)}N$ layer comprises convexes or concaves which are spaced from each other in the range of 200 nm to 3 μm and have a width and a height of 200 nm to 3 μm. The rough pattern formed on the n-doped $Al_xGa_yIn_{(1-x-y)}N$ layer may form a photonic crystal.

In the specification, 'group III-nitride' designates a binary, ternary or quaternary compound semiconductor having a composition expressed by $Al_xGa_yIn_{(1-x-y)}N$ ($0 \leq x \leq 1$, $0 \leq y \leq 1$, $0 \leq x+y \leq 1$). Also, 'a group III-nitride light emitting device' means that an n-type clad payer, active layer and p-type clad layer constituting the light emitting structure are made of the group III-nitride.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Figure 1:
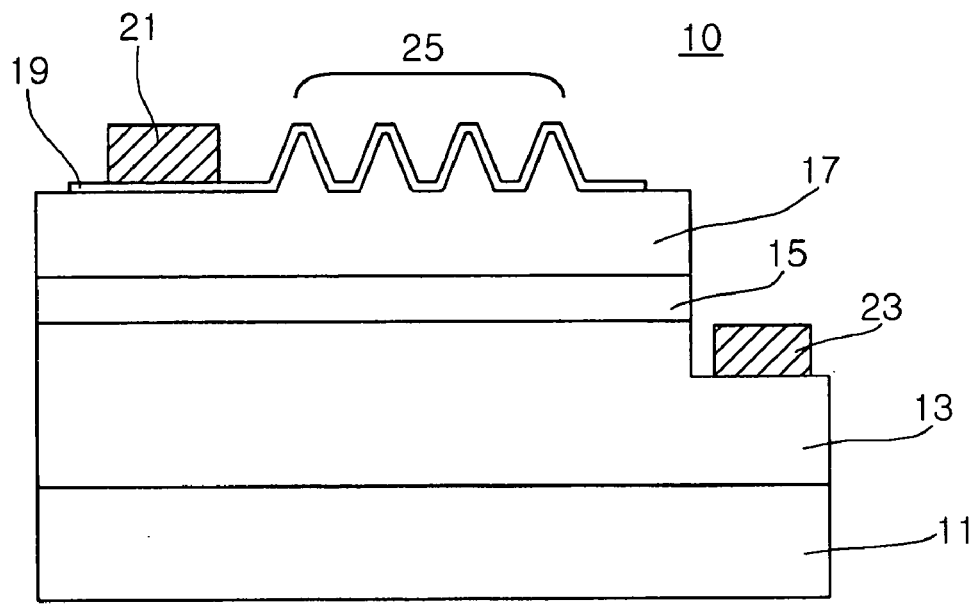
FIG. 1 is a sectional view illustrating a conventional group III-nitride light emitting device.

Preferred embodiments of the present invention will now be described in detail with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals are used throughout the different drawings to designate the same or similar components.

Figure 2:
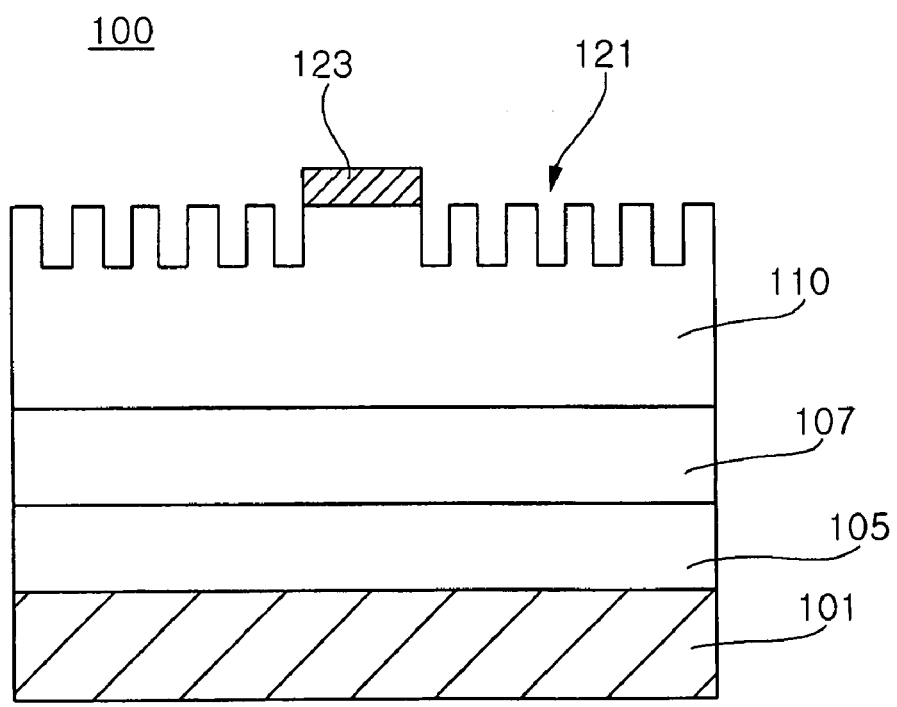
FIG. 2 is a sectional view illustrating a vertical group III-nitride light emitting device manufactured according to an embodiment of the present invention.

FIG. 2 is a sectional view illustrating a vertical group III-nitride light emitting device manufactured according to one embodiment of the present invention. With reference to FIG. 2, the vertical group III nitride light emitting device 100 includes a p-doped $Al_mGa_nIn_{(1-m-n)}N$ layer 105, an active layer 107, and an n-doped $Al_xGa_yIn_{(1-x-y)}N$ layer 110 sequentially stacked on a silicon or metal conductive substrate 101. In addition, an n-electrode 123 is formed on the n-doped $Al_xGa_yIn_{(1-x-y)}N$ layer 110.

As shown in FIG. 2, the n-doped $Al_xGa_yIn_{(1-x-y)}N$ layer 110 has a rough pattern 121 formed on the upper surface thereof except on a part of the surface where the n-electrode 123 is formed. The light that reaches the rough pattern 121 is scattered by the rough pattern, and thus the light is easily extracted out of the light emitting device 100. Consequently, the extraction efficiency of the light emitting device 100 is improved.

As will be described later, to form the rough pattern 121, an insulating pattern formed on the basic substrate is transferred to the n-doped $Al_xGa_yIn_{(1-x-y)}N$ layer 110. Therefore, the rough pattern 121 can be formed at regular intervals and in precise dimensions. In order to obtain a sufficient scattering effect, it is preferable that the rough pattern 121 has convexes (e.g. pillars) or concaves that are spaced from each other in the range of 20 nm to 100 μm, and have a width and a height of 20 nm to 100 μm. More preferably, the convexes or concaves of the rough pattern are spaced from each other in the range of 200 nm to 3 μm, and have a width and a height of 200 nm to 3 μm. The convexes of the rough pattern 121 may be spaced from each other up to 3 μm to allow formation of a photonic crystal on the n-doped $Al_xGa_yIn_{(1-x-y)}N$ layer 110. Such a photonic crystal can diffract light by a law of diffraction, not a law of reflection. Thus, the photonic crystal significantly enhances the extraction efficiency.

Between the conductive substrate 101 and the p-doped $Al_mGa_nIn_{(1-m-n)}N$ layer 105, a reflection layer (not shown) made of, for example, a $CuInO_2$/Ag layer, a $CuInO_2$/Al layer or an Ni/Ag/Pt layer can be formed. Such a reflection layer reflects light toward a light exiting surface, thereby further improving extraction efficiency. A transparent electrode layer (not shown) made of such as ITO which aids uniform light emission may be formed on the n-doped $Al_xGa_yIn_{(1-x-y)}N$ layer 110 with the rough pattern 121 formed thereon.

Figure 3:
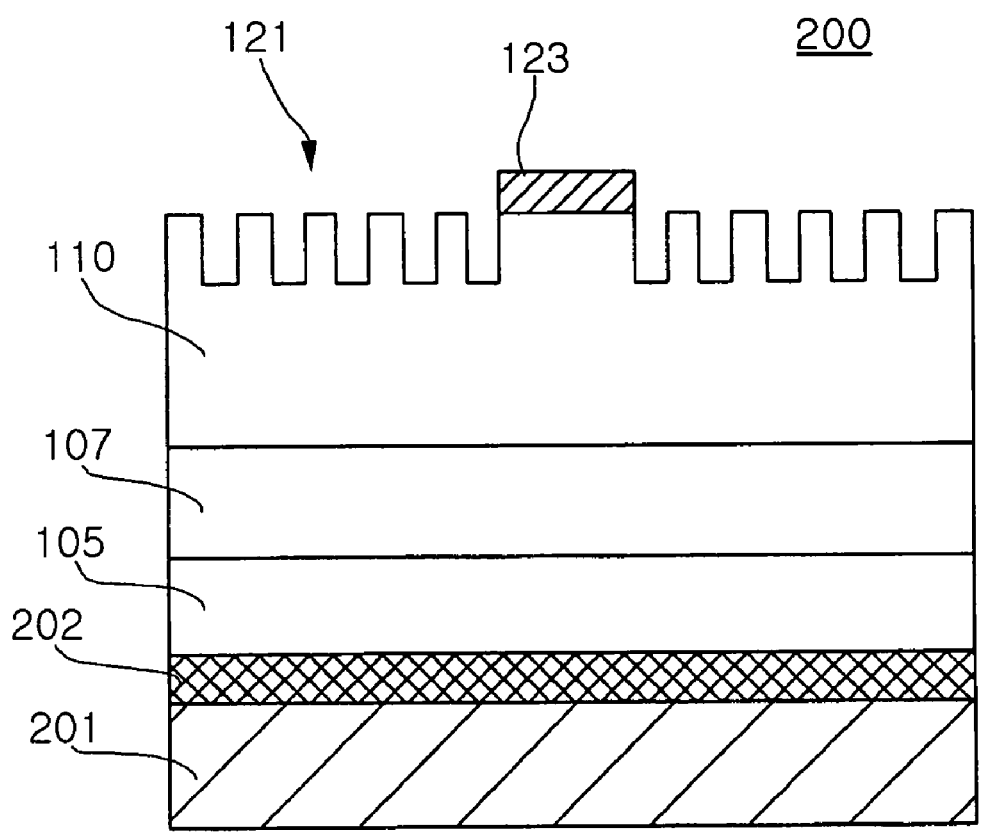
FIG. 3 is a sectional view illustrating a vertical group III-nitride light emitting device manufactured according to another embodiment of the present invention.

FIG. 3 is a sectional view illustrating a vertical group III-nitride light emitting device manufactured according to another embodiment. The light emitting device 200 shown in FIG. 3 has a conductive substrate 201 bonded by a conductive adhesive layer 202. The conductive adhesive layer 202 may be composed of Au, Au—Sn, Sn, In, Au—Ag or Pb—Sn. Such a conductive adhesive layer 202 functions to bond the conductive substrate 201 to the light emitting structure including the semiconductor layers 105, 107 and 110. Particularly, as the conductive adhesive layer 202 may be made of metal or alloys, it has a relatively high reflectivity. Accordingly, the reflectivity of the conductive adhesive layer 202 has an effect of enhancing the luminance of the light emitting device 200. Other constituent parts are identical to those explained with reference to FIG. 2, and thus detailed explanation thereof is omitted.

Now, an explanation is given on a method for manufacturing a vertical group III-nitride light emitting device according to the present invention. FIGS. 4 to 10 are sectional views for explaining the method for manufacturing the vertical group III-nitride light emitting device according to one embodiment.

Figure 4:
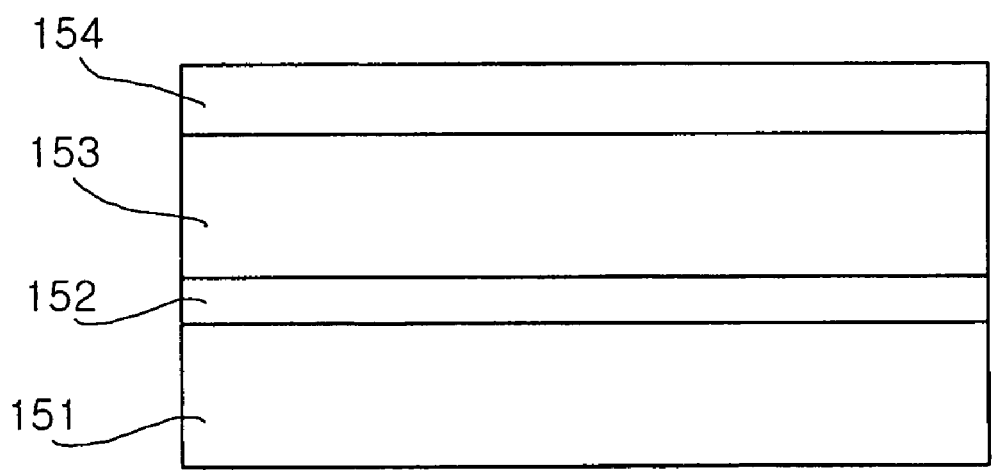
FIGS. 4 to 10 are sectional views illustrating a method for manufacturing the vertical group III-nitride light emitting device according to an embodiment of the present invention.

First, referring to FIG. 4, a low-temperature GaN buffer layer 152, an undoped GaN layer 153 and an insulating layer 154 are sequentially formed on a basic substrate 151 of sapphire. The low-temperature GaN buffer layer 152 functions to enhance crystallinity of the GaN layer grown thereon. The low-temperature GaN buffer layer 152 can be formed, for example, by growing GaN on the basic substrate 151 at a temperature ranging from 500 to 700° C. The insulating layer 154 may be composed of, for example, a silicon oxidation film ($SiO_2$) or a silicon nitride film ($SiN_x$).

In this embodiment, a sapphire substrate is used for the basic substrate for the growth of semiconductor layers but alternatively, other substrates such as a SiC substrate can be used.

Figure 5:
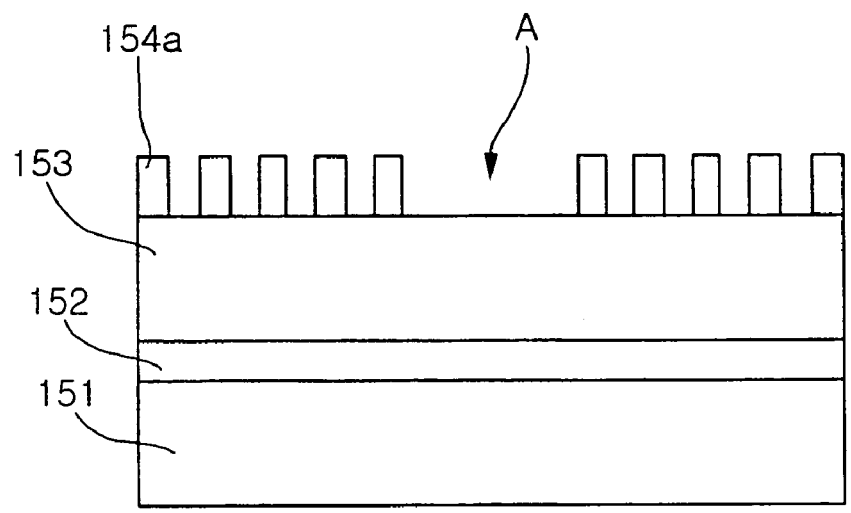

Next, as shown in FIG. 5, the insulating layer is selectively etched via a photo-etching process to form an insulating pattern 154a on the undoped GaN layer 153. With this process, the surface of the undoped GaN layer 153 is selectively exposed by the insulating pattern 154a. It is preferable that the insulating pattern 154a has convexes or concaves that are spaced from each other in the range of 20 nm to 100 µm, and have a width and a height of 20 nm to 100 µm. More preferably, the convexes or concaves are spaced from each other in the range of 200 nm to 3 µm, and have a width and a height of 200 nm to 3 µm. The height of the insulating pattern 154a can be controlled by the thickness of the insulating layer 154.

In order to form the insulating pattern 154a as described above, the basic substrate 151 is used as a mount to conduct the photo-etching process on the insulating layer 154. Thus, the formation process of the insulating pattern 154a is relatively easy and the insulating pattern 154a can be formed at regular intervals and in precise dimensions. As will be described later, such an insulating pattern 154a is needed to form a rough surface pattern on the n-doped $Al_xGa_yIn_{(1-x-y)}N$ layer. Particularly, the insulating pattern 154a is formed with convexes or concaves spaced from each other up to 3 µm on the undoped GaN layer 153, thus forming the rough pattern of photonic crystal on the n-doped $Al_xGa_yIn_{(1-x-y)}N$ layer, which will be formed in a subsequent process.

As shown in FIG. 5, the insulating pattern 154a is not formed on a partial area A of an upper surface of the undoped GaN layer 153. The area A corresponds to an area where an n-electrode is to be formed later. As will be described later, the area A corresponding to the n-electrode does not have the insulating pattern, thereby preventing increase in contact resistance of the n-electrode.

Figure 6:
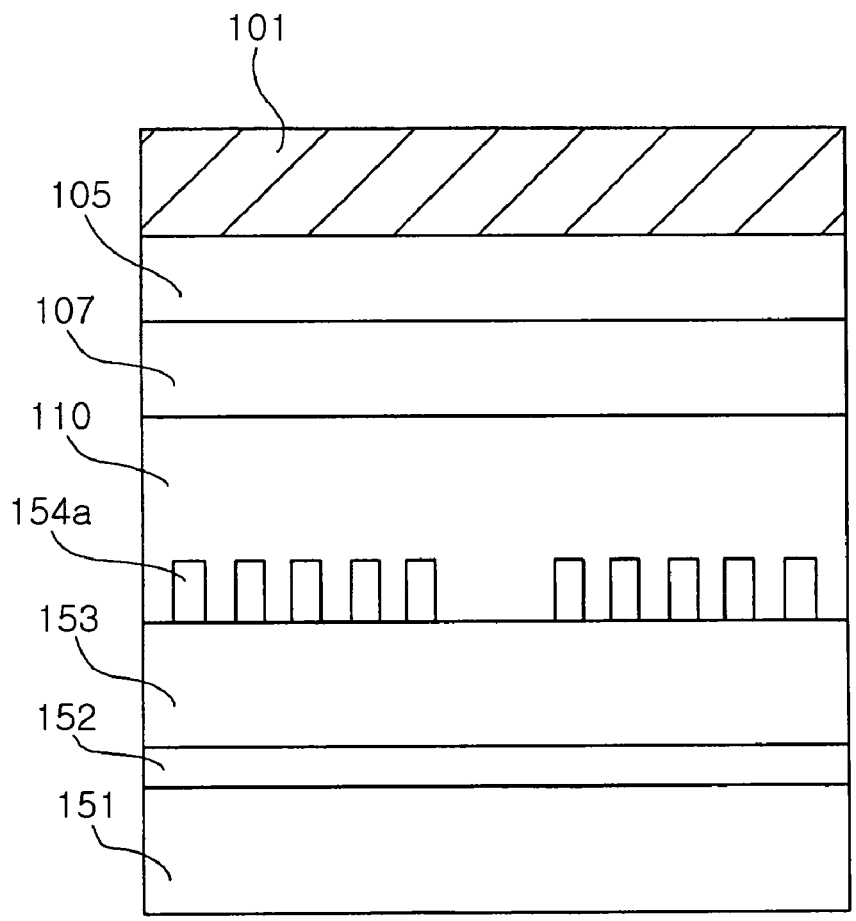

Next, with reference to FIG. 6, an n-doped $Al_xGa_yIn_{(1-x-y)}N$ layer 110 ($0 \leq x \leq 1$, $0 \leq y \leq 1$, $0 \leq x+y \leq 1$) is formed on the insulating pattern 154a, and then an active layer 107 and a p-doped $Al_mGa_nIn_{(1-m-n)}N$ layer ($0 \leq m \leq 1$, $0 \leq n \leq 1$, $0 \leq m+n \leq 1$) 105 are sequentially formed on the n-doped layer 110. Afterwards, a metal layer is plated on the p-doped $Al_mGa_nIn_{(1-m-n)}N$ layer 105 to form a conductive substrate 101. The conductive substrate 101 formed by plating may be composed of, for example, tungsten, copper, nickel, titan or alloys of at least two thereof.

The n-doped $Al_xGa_yIn_{(1-x-y)}N$ layer 110 is formed on the insulating pattern 154a, as shown in FIG. 6, using the Epitaxial Lateral Overgrowth (ELOG). To be specific, the n-doped $Al_xGa_yIn_{(1-x-y)}N$ layer is regrown from the undoped GaN layer 153, but not grown from the insulating pattern 154a composed of $SiO_2$ or $SiN_x$. Thus, the n-doped $Al_xGa_yIn_{(1-x-y)}N$ layer is grown via a type of Selective Epitaxial Growth (SEG). Therefore, in order for the n-doped $Al_xGa_yIn_{(1-x-y)}N$ to grow from the surface of the undoped GaN layer 153 exposed by the insulating pattern 154a and completely cover the insulating pattern 154a, the n-doped $Al_xGa_yIn_{(1-x-y)}N$ needs to be laterally overgrown. That is, the n-doped $Al_xGa_yIn_{(1-x-y)}N$ is grown by ELOG.

The n-doped $Al_xGa_yIn_{(1-x-y)}N$ which is grown from the surface of the undoped GaN layer 153 and laterally overgrown has an interface shaped according to the insulating pattern 154a. As a result, as shown in FIG. 6, the n-doped $Al_xGa_yIn_{(1-x-y)}N$ layer 110 having a rough structure or pattern corresponding to the insulating pattern 154a is obtained (The insulating pattern 154a will be removed later to expose the rough pattern 121 of the $Al_xGa_yIn_{(1-x-y)}N$ layer 110 (see FIG. 9)). As explained above with reference to FIG. 5, the insulating pattern 154a is not formed in 'the area corresponding to the n-electrode (area A of FIG. 5)', and correspondingly the rough pattern 121 of the n-doped $Al_xGa_yIn_{(1-x-y)}N$ layer 110 is not formed in this area either.

As described above, in case of forming the n-doped $Al_xGa_yIn_{(1-x-y)}N$ layer 110 via ELOG, the defect density of the n-doped $Al_xGa_yIn_{(1-x-y)}N$ layer 110 can be lowered. This is due to the reduced contact area between the regrown n-doped $Al_xGa_yIn_{(1-x-y)}N$ layer 110 and the undoped GaN layer 153. That is, the contact area between the n-doped $Al_xGa_yIn_{(1-x-y)}N$ layer 110 and the undoped GaN layer 153 is reduced as much as the area of the insulating pattern 154a. Therefore, less of crystal defects such as thermal stress or dislocation existing in the undoped GaN layer 153 is transferred to the n-doped $Al_xGa_yIn_{(1-x-y)}N$ layer 110. In addition, there is no chemical or crystallographical bonding between the insulating pattern 154a and the n-doped $Al_xGa_yIn_{(1-x-y)}N$ layer 110. Therefore, thermal stress and crystal defect is not easily transferred to the n-doped $Al_xGa_yIn_{(1-x-y)}N$ layer 110.

Although not shown in FIG. 6, a reflection layer composed of a $CuInO_2$/Ag layer, a $CuInO_2$/Al layer or an Ni/Ag/Pt layer may be formed between the p-doped $Al_mGa_nIn_{(1-m-n)}N$ layer 105 and the conductive substrate 101. Such a reflection layer reflects the light toward a light exiting surface, further enhancing the extraction efficiency.

Figure 7:
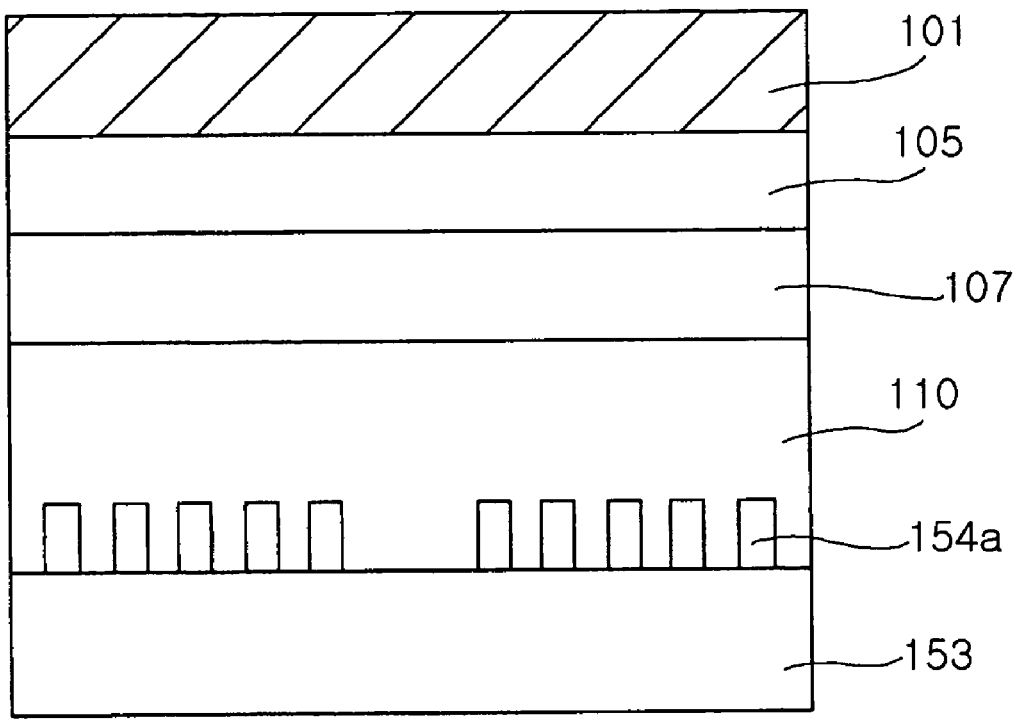

Next, as shown in FIG. 7, the basic substrate 151 and the low-temperature GaN buffer layer 152 are separated or removed from the light emitting structure. The basic substrate 151 can be separated, for example, via a laser lift-off process. That is, a laser beam is irradiated on the lower part of the basic substrate 151 to generate instantaneous stress, separating the basic substrate 151.

Figure 8:

Next, as shown in FIG. 8, the undoped GaN layer 153 is removed. The undoped GaN layer 153 can be removed using, for example, dry etching such as Inductively Coupled Plasma—Reactive Ion Etching (ICP-RIE) or Chemical Mechanical Polishing (CMP).

Figure 9:
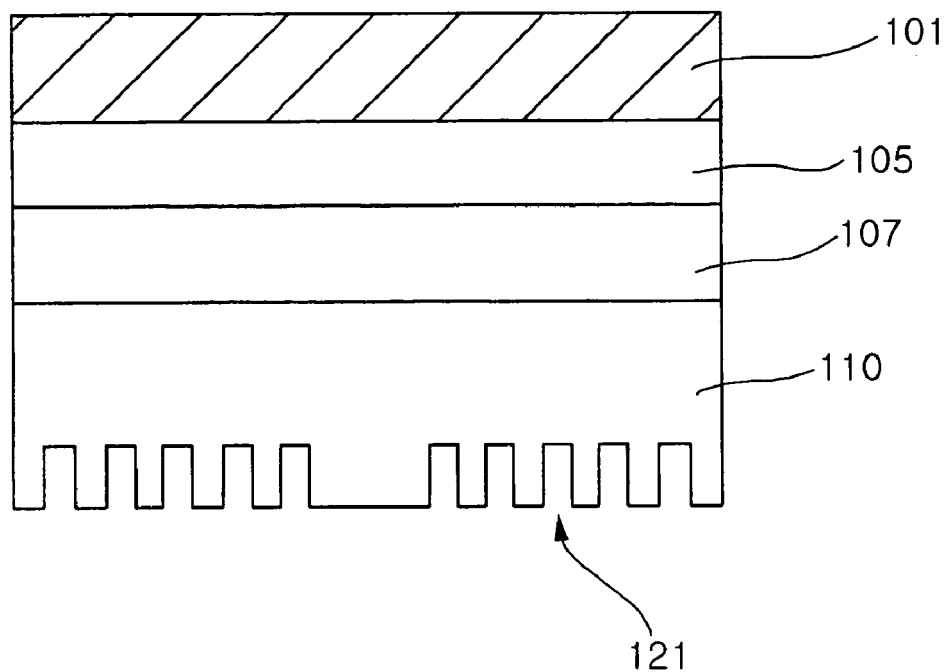

Next, as shown in FIG. 9, the insulating pattern 154a is removed. This allows the rough pattern 121 formed on the interface of the n-doped $Al_xGa_yIn_{(1-x-y)}N$ layer 110 to be exposed to outside. The rough pattern 121 is transferred from the insulating pattern 154a, thus having the same intervals, width and height as the insulating pattern 154a. The insulating pattern 154a can be easily removed by wet etching. For example, the insulating pattern 154a made of $SiO_2$ can be easily removed by an etchant containing buffered HF (BHF). The insulating pattern 154a made of $SiN_x$ can be removed by an etchant containing phosphoric acid.

Figure 10:
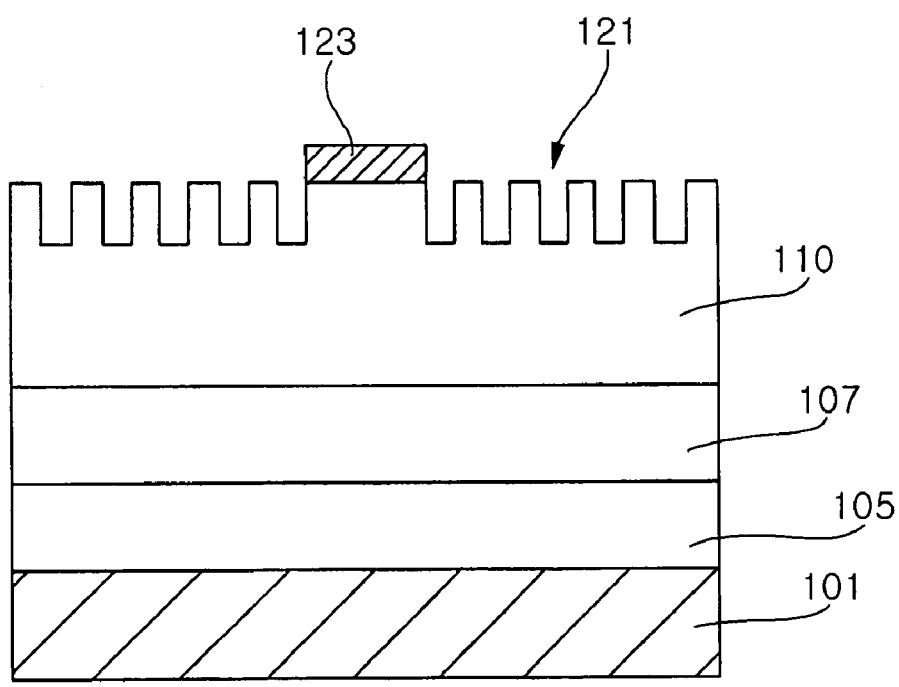

Next, as shown in FIG. 10, an n-electrode 123 is formed on an area of the exposed surface of the n-doped $Al_xGa_yIn_{(1-x-y)}N$ layer 110 without the rough patterns 121. This completes a vertical group III-nitride light emitting device according to the embodiment. In the case where the n-electrode 123 is formed on the surface with the rough pattern 121, contact resistance of the n-electrode 123 is increased. Therefore, in order to prevent such increase in contact resistance, it is preferable to form the n-electrode on an area without the rough patterns 121. Before forming the n-electrode 123, a transparent electrode layer (not shown) made of ITO may be formed and the like on the exposed surface of the n-doped $Al_xGa_yIn_{(1-x-y)}N$ layer 110. Such a transparent electrode aids uniform light emission.

In the manufacturing method described above, the conductive substrate 101 is formed by plating on the p-doped $Al_mGa_nIn_{(1-m-n)}N$ layer 105 (see FIG. 6). In another embodiment, the conductive substrate can be formed on the p-doped $Al_mGa_nIn_{(1-m-n)}N$ layer 105 using a bonding process instead of plating. That is, a silicon or a metal conductive substrate 201 is prepared in advance and the prepared conductive substrate 201 can be bonded to the p-doped $Al_mGa_nIn_{(1-m-n)}N$ layer 105 using a conductive adhesive layer 202 (see FIG. 3). In this case, the rest of the processes other than the bonding process of the conductive substrate are identical to those in the embodiment described hereinabove (see FIGS. 4 to 10). For the conductive adhesive layer 202, Au, Au—Sn, Sn, In, Au—Ag or Pb—Sn can be used. Such a conductive adhesive layer 202 made of metal or alloys has a relatively high reflectivity, which is advantageous for improving luminance.

Figure 11:
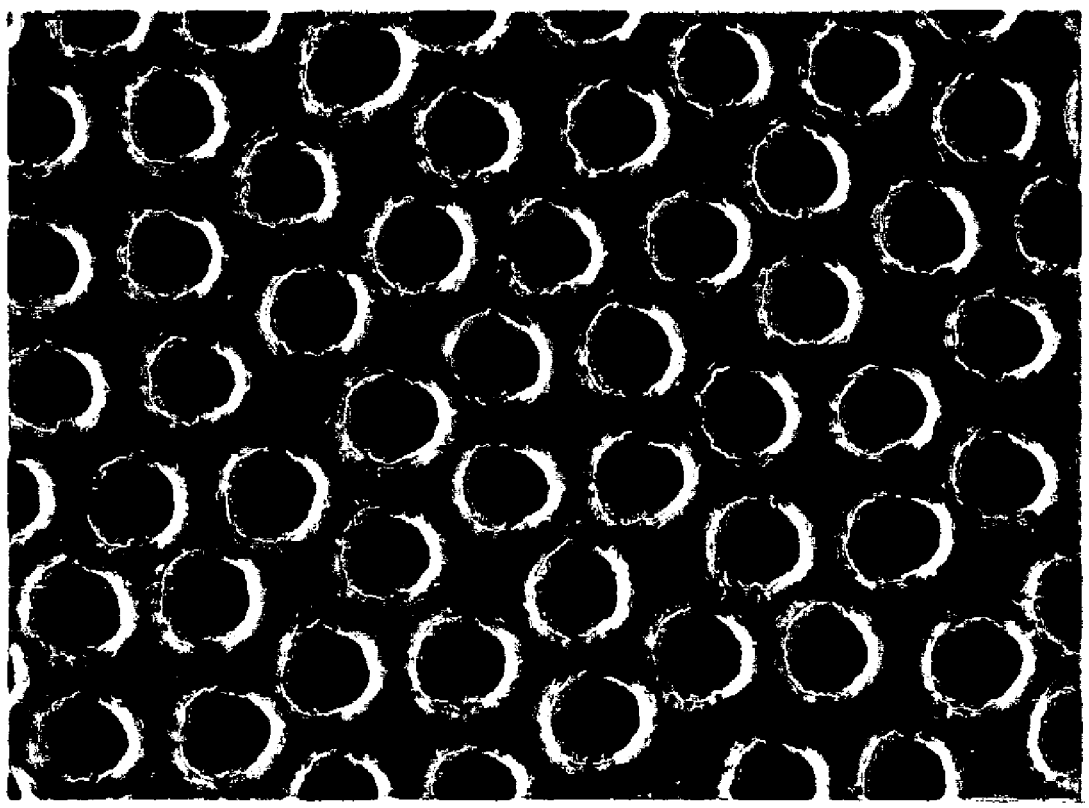
FIG. 11 is a Scanning Electron Microscopy (SEM) picture illustrating a rough pattern formed on an upper part of the vertical group III nitride light emitting device manufactured according to the present invention.

FIG. 11 is a SEM picture showing the rough pattern 121 formed on the upper surface of the n-doped $Al_xGa_yIn_{(1-x-y)}N$ layer 110. As shown in FIG. 11, the rough pattern has a clearly defined shape and a regular interval. It is preferable that convexes or concaves of the rough pattern are spaced from each other in the range of 20 nm to 100 μm and have a width and a height of 20 nm to 100 μm. In particular, having an interval and a width in the range of 200 nm to 3 μm allows formation of a photonic crystal. Such a rough pattern of a photonic crystal functions to significantly enhance the extraction efficiency. As the process of forming the insulating patterns 154a in precise dimensions on the basic substrate 151 can be relatively easy (refer to FIG. 5), it is also easy to form the rough pattern 121 in precise dimensions on the n-doped $Al_xGa_yIn_{(1-x-y)}N$ layer. Consequently, the product yield is improved.

According to the present invention as set forth above, an insulating pattern formed on a basic substrate is transferred to an n-doped $Al_xGa_yIn_{(1-x-y)}N$ layer, allowing an easy manufacture of a vertical group III-nitride light emitting device having a high extraction efficiency and improved luminance at a greater yield. In addition, as the n-doped $Al_xGa_yIn_{(1-x-y)}N$ layer is grown via ELOG on the insulating pattern, crystal defect density of the light emitting structure is lowered. The forward or operating voltage $V_f$ can also be lowered in the vertically structured light emitting device with high luminance and low crystal defect rate.

While the present invention has been shown and described in connection with the preferred embodiments, it will be apparent to those skilled in the art that modifications and variations can be made without departing from the spirit and scope of the invention as defined by the appended claims.

What is claimed is:

1. A method for manufacturing a vertical group III-nitride light emitting device comprising steps of:
   (i) forming an undoped GaN layer and an insulating layer sequentially on a basic substrate;
   (ii) selectively etching the insulating layer to form an insulating pattern on the undoped GaN layer;
   (iii) sequentially forming an n-doped $Al_xGa_yIn_{(1-x-y)}N$ layer, where $0 \leq x \leq 1$, $0 \leq y \leq 1$, $0 \leq x+y \leq 1$, an active layer and a p-doped $Al_mGa_nIn_{(1-m-n)}N$ layer, where $0 \leq m \leq 1$, $0 \leq n \leq 1$, $0 \leq m+n \leq 1$ on the insulating pattern;
   (iv) forming a conductive substrate on the p-doped $Al_mGa_nIn_{(1-m-n)}N$ layer;
   (v) removing the basic substrate, the undoped GaN layer and the insulating pattern to expose a rough pattern on the n-doped $Al_xGa_yIn_{(1-x-y)}N$ layer; and
   (vi) forming an n-electrode on a part of the exposed surface of the n-doped $Al_xGa_yIn_{(1-x-y)}N$ layer.

2. The method according to claim 1, wherein the insulating layer comprises a silicon oxide film or silicon nitride film.

3. The method according to claim 1, wherein the step (v) comprises:
   separating or removing the basic substrate using a laser lift-off process;
   removing the undoped GaN layer using dry etching or chemical mechanical polishing (CMP); and
   removing the insulating pattern using wet etching.

4. The method according to claim 1, wherein the n-doped $Al_xGa_yIn_{(1-x-y)}N$ layer is formed by growing n-doped $Al_xGa_yIn_{(1-x-y)}N$ via epitaxial lateral overgrowth.

5. The method according to claim 1, further comprising:
   forming a low-temperature GaN buffer layer on the basic substrate before the step (i).

6. The method according to claim 1, wherein in the step (ii), the insulating pattern is not formed on a top surface area of the undoped GaN layer corresponding to the n-electrode.

7. The method according to claim 1, wherein the conductive substrate comprises a silicon substrate or a metal substrate.

8. The method according to claim 1, wherein the step (iv) comprises plating a metal layer on the p-doped $Al_mGa_nIn_{(1-m-n)}N$ layer.

9. The method according to claim 8, wherein the metal layer comprises one selected from a group consisting of tungsten, copper, nickel, titan and alloys of at least two thereof.

10. The method according to claim 1, wherein the step (iv) comprises preparing a preliminary conductive substrate beforehand and bonding the prepared preliminary conductive substrate on the p-doped $Al_mGa_nIn_{(1-m-n)}N$ layer using a conductive adhesive layer.

11. The method according to claim 10, wherein the conductive adhesive layer comprises material selected from a group consisting of Au, Au—Sn, Sn, In, Au—Ag and Pb—Sn.

12. The method according to claim 1, further comprising:
forming a reflective layer on the p-doped $Al_mGa_nIn_{(1-m-n)}N$ layer between the step (iii) and the step (iv).

13. The method according to claim 12, wherein the reflective layer comprises one selected from a group consisting of a $CuInO_2$/Ag layer, a $CuInO_2$/Al layer and an Ni/Ag/Pt layer.

14. The method according to claim 1, further comprising forming a transparent electrode layer on the n-doped $Al_xGa_yIn_{(1-x-y)}N$ layer after the step (v).

15. The method according to claim 1, wherein the rough pattern formed on the n-doped $Al_xGa_yIn_{(1-x-y)}N$ layer comprises convexes or concaves which are spaced from each other in the range of 20 nm to 100 μm and have a width and a height of 20 nm to 100 μm.

16. The method according to claim 1, wherein the rough pattern formed on the n-doped $Al_xGa_yIn_{(1-x-y)}N$ layer comprises convexes or concaves which are spaced from each other in the range of 200 nm to 3 μm and have a width and a height of 200 nm to 3 μm.

17. The method according to claim 1, wherein the rough pattern formed on the n-doped $Al_xGa_yIn_{(1-x-y)}N$ layer comprises a photonic crystal.

18. The method according to claim 1, wherein the basic substrate comprises a sapphire substrate.

* * * * *